United States Patent [19]
Hobson et al.

[11] Patent Number: 6,044,100
[45] Date of Patent: Mar. 28, 2000

[54] LATERAL INJECTION VCSEL

[75] Inventors: William Scott Hobson, Summit; Daryoosh Vakhshoori, Chatham Township, Morris County, both of N.J.

[73] Assignee: Lucent Technologies Inc., Murray Hill, N.J.

[21] Appl. No.: 08/997,712

[22] Filed: Dec. 23, 1997

[51] Int. Cl.$^7$ .............................. H01S 3/19; H01L 29/06
[52] U.S. Cl. ............................... 372/46; 372/43; 372/44; 372/45; 372/50; 257/15; 257/18; 257/23
[58] Field of Search ................................ 372/43, 44, 45, 372/46, 47, 48, 50; 257/15, 18, 23

[56] References Cited

U.S. PATENT DOCUMENTS

| | | | |
|---|---|---|---|
| 4,819,039 | 4/1989 | Chi et al. | 357/17 |
| 5,164,949 | 11/1992 | Ackley et al. | 372/45 |
| 5,206,871 | 4/1993 | Deppe et al. | 372/45 |
| 5,293,392 | 3/1994 | Shieh et al. | 372/45 |
| 5,343,487 | 8/1994 | Scott et al. | 372/46 |
| 5,557,626 | 9/1996 | Grodzinski et al. | 372/45 |
| 5,835,521 | 11/1998 | Ramdani et al. | 372/96 |
| 5,903,586 | 5/1999 | Ramdani et al. | 372/45 |
| 5,903,590 | 5/1999 | Hadley et al. | 372/96 |

OTHER PUBLICATIONS

Y. H. Lee et al., *Top–Surface* . . . , Electr. Lett., vol. 26, No. 11, pp. 710–711 (1990).

J.M. Dallesasse et al., *Hydrolization oxidation* . . . , Appl. Phys. Lett., vol. 57, No. 26, pp. 2844–2846 (1990).

S. J. Pearton et al., *Implant Isolation* . . . , Materials Res. Soc. Symp. Proc., vol. 216, pp. 451–457 (1991).

A. R. Sugg et al., *Native oxide–embedded* . . . , Appl. Phys. Lett., vol. 62, No. 11, pp. 1259–1261 (1993).

D. L. Huffaker et al., *Native oxide–defined* . . . , Appl. Phys. Lett., vol. 65, No. 1, pp. 97–99 (1994).

K. D. Choquette et al., *Low threshold voltage* . . . , Electr. Lett., vol. 30, No. 24, pp. 2043–2044 (1994).

T. E. Sale, *Vertical Cavity Surface Emitting Lasers*, Research Studies Press Ltd., pp. 117–127 (1995).

R. F. Nabiev et al., *Voltage Drop* . . . , IEEE Phot. Tech. Lett., vol. 7, No. 7, pp. 733–735 (1995).

M. H. MacDougal et al., *Electrically–Pumped* . . . , IEEE Phot. Tech. Lett., vol. 8, No. 3, pp. 310–312 (1996).

J. K. Guenter et al., *Reliability of proton–implanted* . . . , Proc. SPIE, vol. 2683, pp. 102–113 (1996).

K. D. Choquette et al., *Advances in Selective* . . . , IEEE J. Selected Topics in Quantum Electronics, vol. 3, No. 3, pp. 916–925 (Jun. 1997).

M. B. Tayahi et al. *High power* . . . , Electr. Lett., vol. 33, No. 21, pp. 1794–1795 (Oct. 1997).

E. M. Levin et al., *Phase Diagrams for Chemists*, M. K. Reser, Editor, The American Ceramic Society, p. 430 (1964).

*Primary Examiner*—Brian Healy
*Attorney, Agent, or Firm*—Eugen E. Pacher

[57] ABSTRACT

A VCSEL comprises a pair of multi-layered mirrors forming an optical cavity resonator having its axis perpendicular to the layers of the mirrors, an active region disposed within the resonator, and a current guide for directing pumping current through an aperture to generate stimulated emission of radiation which propagates along the resonator axis. A portion of the radiation forms an output signal which emerges through at least one of the mirrors. The current guide includes a lateral injection structure disposed between one of the mirrors and the current aperture. The lateral injection structure comprises at least one relatively thin, highly doped semiconductor layer, each of the highly doped layer(s) being located at a node of the standing wave of the intracavity radiation, at least one lower doped semiconductor layer disposed adjacent each of the highly doped layers (e.g., one lower doped layer sandwiched between a pair of highly doped layers), and an etch stop layer disposed between the one mirror and the uppermost highly doped layer.

12 Claims, 1 Drawing Sheet

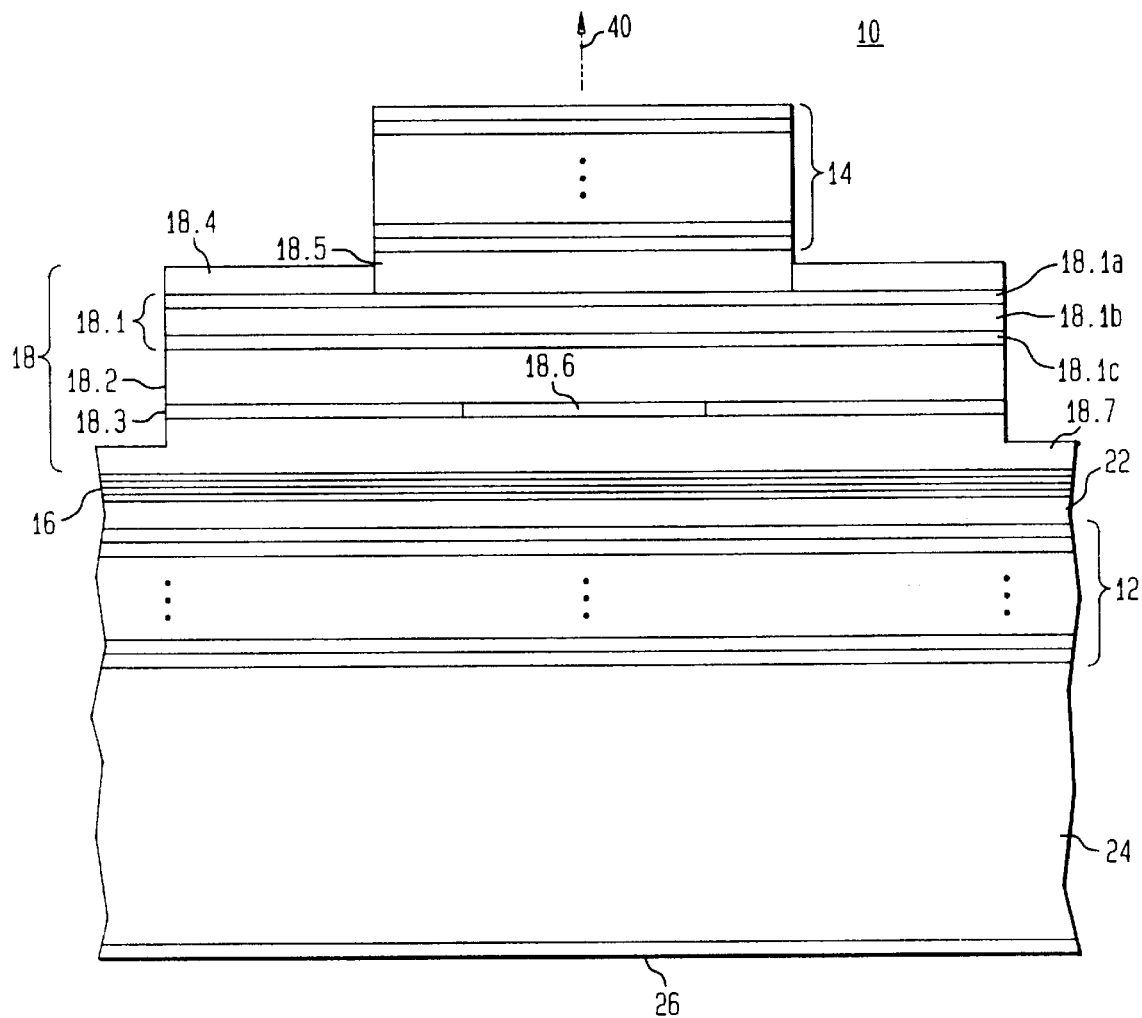

LATERAL INJECTION VCSEL

CROSS-REFERENCE TO RELATED APPLICATIONS

This application was concurrently filed with application Ser. No. 08/997,711, pending, entitled Optical Devices Having ZnS/Ca-Mg-Fluoride Multi-layered Mirrors (Chirovsky 14-8-44) and application Ser. No. 08/997,710, pending entitled Vertical Cavity Surface-Emitting Laser with Separate Optical and Current Guides (Chirovsky 13-27-8-7-4-5-4-43).

FIELD OF THE INVENTION

This invention relates generally to vertical cavity surface-emitting lasers (VCSELs) and, more particularly, to such lasers in which the active region is pumped by means of a lateral injection structure.

BACKGROUND OF THE INVENTION

As compared with conventional edge-emitting semiconductor lasers, VCSELs hold the promise of a number of desirable characteristics. For example, the shorter cavity resonator of the VCSEL provides for better longitudinal mode selectivity, and hence narrower linewidths. The use of multi-layered DBR mirrors to form a cavity resonator perpendicular to the layers obviates the need for the cleaving operation common to edge emitting lasers. This orientation of the resonator also facilitates both the fabrication of laser arrays and wafer-level testing of the individual lasers.

The prior art has proposed two basic VCSEL designs: one defines a current confinement region in a p-doped semiconductor DBR mirror by means of an apertured, high resistivity ion-implanted region (See, for example, Y. H. Lee et al.,*Electr. Lett.*, Vol. 26, No. 11, pp. 710–711 (1990) and T. E. Sale, *Vertical Cavity Surface Emitting Lasers*, Research Press Ltd., pp. 117–127 (1995), both of which are incorporated herein by reference.), whereas the other defines the current confinement region by means of an apertured, high resistivity oxide layer (See, for example, D. L. Huffaker et al.,*Appl Phys. Lett.*, Vol. 65, No. 1, pp. 97–99 (1994) and K. D. Choquette et al., *Electr. Lett.*, Vol. 30, No. 24, pp. 2043–2044 (1994), both of which are incorporate herein by reference.) In either case, the active region, frequently located in a mesa, is pumped by current which is made to flow through the aperture to the active region. In most VCSELs this pumping current also flows through the semiconductor layers of the DBR mirrors. In order to reduce free-carrier absorption, which can adversely affect laser efficiency, while also reducing the series resistance of the laser, the prior art has resorted to elaborate doping and compositional profile schemes. (See, for example, R. F. Nabiev et al., *IEEE Photonics Technology Lett.*, Vol. 7, No. 7, pp. 733–735 (1995), which is incorporated herein by reference.) On the other hand, some VCSELs replace one or both semiconductor mirrors with dielectric mirrors. In this case a lateral injection structure is used to pump the active region. To date, the structure is simply a moderately doped semiconductor layer of uniform doping interposed between the current confinement aperture and one of the laser electrodes. (See, for example, M. H. MacDougal et al., *IEEE Photonics Technology Lett.*, Vol 7, No. 3, pp. 310–312 (1996), which is incorporated herein by reference.) This layer serves to reduce free carrier absorption and to spread the current so that the full width of the VCSEL mesa is more uniformly pumped. However, the moderately doped layer of this design renders it difficult to make low resistance ohmic contact to the lateral injection layer. In addition, the diameter of the VCSEL is limited for practical doping concentrations because of the need for uniform current injection (i.e., uniform pumping of the active region).

Thus, a need remains in the art for a VCSEL design that allows for larger VCSEL mesas and thus higher power operation, while at the same time having relatively low series resistance.

SUMMARY OF THE INVENTION

In accordance with one aspect of our invention, a VCSEL comprises a pair of multi-layered mirrors forming an optical cavity resonator having its axis perpendicular to the layers of the mirrors, an active region disposed within the resonator, and a current guide for directing pumping current through an aperture to generate stimulated emission of radiation which propagates along the resonator axis. A portion of the radiation forms an output signal which emerges from the resonator through at least one of the mirrors. The current guide includes a lateral injection structure disposed between one of the mirrors and the current aperture. The lateral injection structure comprises at least one relatively thin, highly doped semiconductor layer, each of the highly doped layer(s) being located at a node of the standing wave of the intracavity radiation, at least one lower doped semiconductor layer disposed adjacent each of the highly doped layers (e.g., one lower doped layer sandwiched between a pair of highly doped layers), and an stop-etch layer disposed between the one mirror and the uppermost highly doped layer.

These structural features provide a VCSEL with several desirable characteristics. First, positioning the highly doped layers at standing wave nodes reduces free carrier absorption. Second, the combination of the highly doped layers and the lower doped layer allows current to spread uniformly across the mesa, thereby permitting the use of larger mesa sizes and hence higher power operation of the VCSEL. Lastly, the stop-etch layer allows ohmic contact to be made effectively to the uppermost, thin highly doped layer with little, if any, risk of overetching the mesa.

BRIEF DESCRIPTION OF THE DRAWINGS

Our invention, together with its various features and advantages, can be readily understood from the following more detailed description taken in conjunction with the accompanying drawing, in which the sole figure is a schematic, cross-sectional view of a VCSEL in accordance with one embodiment of our invention. In the interests of clarity and simplicity the figure has not been drawn to scale.

DETAILED DESCRIPTION OF THE INVENTION

With reference now to the figure, a VCSEL 10 in accordance with one aspect of our invention comprises a pair of multi-layered mirrors 12 and 14 forming an optical cavity resonator with its axis perpendicular to the layers. An active region 16 is disposed within the resonator with its layer(s) oriented perpendicular to the resonator axis. When suitably pumped, the active region generates stimulated emission of radiation (at a free-space center wavelength $\lambda$) which propagates along the resonator axis and emerges from the resonator through one of the mirrors (e.g. first mirror 14) as an output signal 40. In accordance with one feature of our invention, a current guide 18 includes a lateral injection structure 18.1 for delivering pump current through a current confinement aperture 18.6 to the active region 16.

The current guide 18 comprises the lateral injection structure 18.1, an annular first electrode 18.4 formed on structure 18.1, a relatively low conductivity semiconductor layer 18.2 beneath structure 18.1, and a relatively high resistivity semiconductor region or zone 18.3 formed in the layer 18.2. Region 18.3 typically has an annular shape, the central opening of which forms the current confinement aperture 18.6. This annular shape may be defined by suitable masking of aperture 18.6 in conjunction with ion-implanting region 18.3 as described by the Lee et al. and Sale articles, supra, or by oxidizing the peripheral portions of a highly reactive layer (e.g., a Group III–V compound layer having a high Al content) as described by the Huffaker et al. and Choquette et al. articles, supra. Importantly, the structure 18.1 comprises a stop-etch layer 18.5, at least one relatively thin, highly doped semiconductor layer 18.1a adjacent layer 18.5, and at least one relatively lowly doped semiconductor layer 18.1b adjacent layer 18.1a. In a preferred embodiment, a second relatively thin, highly doped semiconductor layer 18.1c is also positioned adjacent layer 18.1b but on the side thereof opposite layer 18.1a. This structure could, of course, be extended to include a stop etch layer and plurality of thin, highly doped layers interleaved with lower doped layers. In all cases, however, each of the highly doped layers would be located at (and effectively straddle) a different node of the standing wave of the intracavity radiation in order to reduce free carrier absorption. To this end, therefore, the thickness of each highly doped layer is a small fraction (e.g., 0.20–0.25) of $\lambda/2n_A$, and the thickness of the lower doped layer is chosen so that the nodes are $N\lambda/2n_A$ apart, where N is positive integer greater than one and $n_A$ is the effective refractive index of the active region. In addition, the highly doped layer(s) effectively form equipotential plane(s) in order to enhance current spreading. On the other hand, the combination of the highly doped layer(s) and the lower doped layer(s) serve to spread the pump current from electrode 18.4 essentially uniformly across the mesa formed by shaping (e.g. etching) the structure 18 and, in some designs, also the active region 16 (as shown in the figure). Spreading pump current in this fashion allows the use of larger mesa sizes (e.g., diameters) and hence enables the VCSEL to operate at higher optical output power levels. Lastly, the stop etch layer 18.5 is placed adjacent the uppermost thin, highly doped layer (i.e., layer 18.1a) so that effective ohmic contact can be made to layer 18.1a without any significant risk of overetching. That is, a selective etchant (dry or wet) is used to shape the mirror 14 and to expose the portion of layer 18.1a where the electrode 18.4 is to be formed, but the etchant attacks the thin, highly doped layer 18.1a at an insignificant rate compared to the etch stop layer 18.5. Thus, essentially the full thickness of the thin layer 18.1a remains after the etching process is completed, which in turn facilitates the formation of good ohmic contacts thereto. This feature also leads to lower series resistance and may yield higher wall-plug efficiencies (i.e., higher ratios of optical output power to electrical input power).

With the inside diameter of the first electrode 18.4 being greater than the diameter of the aperture 18.6, the overall effect of the guide 18 is that current from first electrode 18.4 first flows essentially horizontally (i.e., perpendicular to the resonator axis) along a first path segment through structure 18.1. The high resistivity region 18.3 then causes the current to change directions and to flow essentially vertically (i.e., parallel to the resonator axis) along a second path segment through the upper portion of layer 18.2 to the aperture 18.6. At this point the current continues to flow essentially vertically through the active region 16, intermediate layer 22, mirror 12 and substrate 24 to substrate contact 26.

Electrode 18.4 on the VCSEL is preferably an annular contact, but substrate contact 26 may also be annular to permit an output signal to emerge from the substrate side of the laser. On the other hand, to facilitate applications such as flip-chip bonding of the laser to another chip or a circuit board, the substrate contact may be moved to the same (top) side of the laser as described in copending application, Chirovsky 13-27-8-7-4-5-4-43, supra. For high power operation, a standard heat sink would be thermally coupled to the substrate.

The mirrors are illustratively multi-layered DBR reflectors comprising alternating sets of layers of different refractive index. As depicted, mirrors 12 and 14 comprise alternating epitaxial layers of Group III–V compound semiconductor material, each layer being about $\lambda/4 n_s$ thick, where $n_s$ is the refractive index of the corresponding layer of semiconductor material of the mirror. Typically one set comprises layers of $Al_xGa_{1-x}As$ (e.g., x=1;AlAs) and the other set comprises layers of $Al_yGa_{1-y}As$ (e.g., y=0; GaAs), where x and y are different from one another. Alternatively, either or both of the mirrors may comprise alternating layers of dielectric (i.e., non-epitaxial) material, each layer being about $\lambda/4n_D$ thick, where $n_D$ is the refractive index of the corresponding layer of dielectric material of the mirror. As described in concurrently filed application, Chirovsky 14-8-44, supra, one set may comprise layers of a $MgF_2$-$CaF_2$ composite, whereas the other set comprises layers of ZnS. Composites with approximately a 95% $MgF_2$ and 5% $CaF_2$ by mole fraction in the layer are preferred from the standpoint of layer adhesion (to one another) and optical scattering. Fluoride layers with this composition are preferably obtained by e-beam deposition from a eutectic melt comprising approximately 47% $MgF_2$ and 53% $CaF_2$ by weight or, equivalently, approximately 53% $MgF_2$ and 47% $CaF_2$ by mole fraction. The mirrors are typically deposited on a Group III–V compound semiconductor surface which should be protected from deterioration of, for example, optical smoothness or layer thickness. Therefore, before exposing the surface to processing steps which might adversely affect it, the surface should be protected with a glass layer (preferably an aluminum borosilicate glass). Illustrative of this approach is the formation of a protective glass layer on the optical guide mesa descried in concurrently filed application, Chirovsky 13-27-8-7-4-5-4-43, supra.

In order for the lower mirror 12 to be a dielectric mirror, the substrate 24 would be removed (either entirely or by forming an opening therein to expose the underlying portion of current return layer 22) after the other sections of the laser have been fabricated. Then, the dielectric layers of mirror 12 would be deposited on the layer 22. In this case, an output signal could emanate from both mirrors. Or, one or more pairs of one of the mirrors could be replaced with a high reflectivity metal (e.g., Au or Ag) coating, thus forcing the output signal to emanate only from the other mirror. The metal coating may also serve to reduce the topological profile of the device. The term substrate as used herein means any support member on which other layers of the laser are formed. For example, it might be a single crystal body on which epitaxial layers are grown, or it might be a combination of such a substrate and an epitaxial buffer layer.

The active region 16, disposed between the current guide 18 and the current return layer 22, is preferably located at an anti-node of the standing wave of the intracavity radiation in order to increase the interaction between the optical field of the radiation and the injected minority carriers. The active region may be a single layer, but is preferably a well-known multi-quantum well (MQW) region comprising alternating layers of different bandgap; e.g., GaAs quantum well layers interleaved with AlGaAs barrier layers for operation at a free-space, center wavelength of about 0.85 μm. For operation at other center wavelengths the MQW active region would be made of different semiconductor materials such as InP and InGaAsP (e.g., for operation at 1.3 μm or 1.5 μm), and the mirrors would have to be made of well-known materials that provide suitable reflectivity at those wavelengths. Similarly, for operation at 0.98 μm the MQW active region could be made of InGaAs and GaAs, or of InGaAs and GaAsP.

On the other hand, the layer 22 typically comprises n-type AlGaAs. Likewise, the semiconductor layers of current guide 18 typically comprise AlGaAs and/or GaAs, but layers 18.1a and 18.1c are $p^{++}$—type whereas layers 18.1c and 18.2 are $p^-$—type (also known as π-type).

Although a number of epitaxial growth techniques may be used to form the various semiconductor layers of the VCSEL, molecular beam epitaxy (MBE) and metalorganic chemical vapor deposition (MOCVD) are both well suited to the thickness control required for many of the extremely thin layers; e.g. the layers of the semiconductor mirrors, the lateral injection structure, and the MQW active region. On the other hand, if either (or both) of the mirrors are made of dielectric materials, the layers would typically be formed by e-beam deposition from single crystal sources under conditions which avoid crystalline devitrification. See, for example, concurrently filed application, Chirovsky 14-8-44, supra, and U.S. Pat. No. 5,206,871, granted to D. G. Deppe et al. on Apr. 27, 1993, which is incorporated herein by reference. Other techniques, such as sputtering or plasma deposition, may also be suitable.

EXAMPLE

The following example describes the fabrication of a VCSEL-like device to test the efficacy of our lateral injection structure. Although the fabrication of a single device is described, it will be understood, of course, that typically an array of devices is formed on a single wafer. The various material, dimensions, and other parameters are provided by way of illustration only, and unless otherwise expressly indicated, are not intended to limit the scope of the invention. MOCVD was used to grow all of the semiconductor layers. The term undoped epitaxial layer as used herein generally means that the layer was not intentionally doped, but may have been subject to low level doping from background dopants in the growth chamber. In addition, when describing physical or optical dimensions, the symbol A stands for Angstroms, whereas when describing electric current, it stands for Amperes.

A VCSEL-like device of the general type shown in the figure was designed and fabricated as follows. The device comprised the following elements: an $n^+$—doped single crystal GaAs substrate obtained from commercial sources; DBR mirrors 12 and 14 each comprising 20 pairs of GaAs/AlAs layers ($n^+$—layers each doped with Si to about $3 \times 10^{18} cm^{-3}$ in bottom mirror 12, but undoped in top mirror 14) about 696A/829 A thick, respectively; an n-type $Al_{0.3}Ga_{0.7}As$ layer 22 about 1115 A thick and doped with Si to about $1 \times 10^{18} cm^{-3}$; an MQW active region 16 comprising 3 pairs of undoped $In_{0.2}Ga_{0.8}As/GaAs_{0.85}P_{0.15}$ layers, each layer being about 60 A/110 A thick; a p-type $Al_{0.3}Ga_{0.7}As$ layer 18.7 about 2780 A thick; an AlAs layer about 500 A thick; a high resistivity Al-oxide region 18.3 formed in the AlAs layer at a depth of about 0.1–0.2 μm below the lateral injection structure 18.1 so as to have a circular current aperture 18.6 about 8 μm in diameter; a π-type $Al_{0.3}Ga_{0.7}As$ layer 18.2 about 1360 A thick and doped with C to about $3 \times 10^{17} cm^{-3}$; in the lateral injection structure, a pair of $p^{++}$—type GaAs layers 18.1a and 18.1c each about 300 A thick and doped with C to about $10^{20} cm^{-3}$ and, sandwiched therebetween, a p-type $Al_{0.3}Ga_{0.7}As$ layer 18.1b doped with C to about $3 \times 10^{17} cm^{-3}$ and about 1150 A thick, and an undoped $In_{0.5}Ga_{0.5}P$ stop-etch layer 18.5 about 500 A thick. If this device were operated as a VCSEL, its standing wave pattern would have 6 nodes between the mirrors, and consequently the resonator would be designated as a 3λ cavity.

After the semiconductor layers were epitaxially grown, the devices were processed as follows. A 3000 A thick $SiO_2$ was deposited on top of the wafer and patterned into 10 μm circular dots. Reactive ion etching (RIE) using a $SiCl_4$ plasma etchant was used to etch the top mirror 14 down to the etch-stop layer 18.5. This plasma is highly selective having an etch rate of about 700 A/min. for $Al_{0.3}Ga_{0.7}As$ and less than 10 A/min. for InGaP. The wafer was then oxidized for 1 min. at 350° C. in a furnace in a wet nitrogen ambient ($N_2$ flowing through water at 85° C.). This step allows the encapsulation of the mirror 14 with a thin layer (<0.3 μm) of oxide to protect the mirror layers from being damaged during subsequent wet chemical processing. For example, the next step involved removal of the portions of InGaP stop-etch layer outside the mirror 14 by means of a $HCl/H_3PO_4$ mixture. This step exposed the underlying portions of the highly doped GaAs layer 18.1a and allowed an ohmic contact to be formed on the exposed portions. More specifically, an annular Ti/Au ohmic contact 18.4 was formed by a lift-off process to leave 20 μm diameter circular dots on top of the $SiO_2$ dots This metal layer was then used in a self-aligned RIE step to etch through the AlAs layer 18.3 and stop near (within 0.2 μm of) the active region 16. With the edges of the AlAs layer thus exposed, 20 min. of wet oxidation was performed to laterally oxidize 6 μm into the AlAs layer 18.3 to form the oxide-defined device with an 8 μm aperture 18.6. Then, a Au/Ge/Ni contact was deposited by e-beam evaporation on the bottom of the substrate.

The current-voltage (I-V) characteristic and differential resistance of the lasers were measured. The I-V characteristic showed no current flow until the voltage across the device exceeded about 1.2 V, but thereafter the current increased to about 20 mA at about 3 V. The differential resistance decreased with increasing current (according to a 1/x characteristic) asymptotically approaching 60–70 Ω, the series resistance of the VCSEL-like diode. The devices had a voltage drop of about 2.2 V at a current density of 17 $kA/cm^{-3}$. The voltage drop and series resistance of our lateral injection devices are state of the art.

The devices could readily be operated as VCSELs if, for example, the substrate contact had an opening to permit egress of an output signal, or if the Ti/Au contact were formed so as not to cover the top of mirror 14. In fact, VCSELs having lateral injection structures in accordance with our invention were built and operated as described in concurrently filed application, Chirovsky 13-27-8-7-4-5-4-43, supra,. In these VCSELs the lateral injection structure included a single high conductivity layer and a single lower conductivity layer.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the well known technique of delta-doping may be utilized to dope any of the semiconductor layers, especially those which have high levels of carrier concentration (e.g., layers 18.1a, 18.1c and 22). Moreover, the conductivity types of the various layers could be reversed; e.g., the current guide 18 could be n-type instead of the p-type and the layer 22 could p-type instead of n-type. Finally, for high power operation, the current aperture 18.6 might be, say, 30–40 μm in diameter, rather than the 8 μm used above, and suitable heat sinking to the substrate would be provided.

What is claimed is:

1. A VCSEL comprising a pair of multi-layered mirrors forming a cavity resonator having a resonator as perpendicular to said layers, an active region disposed within said resonator, first and second electrodes, said first electrode surrounding one said mirrors, and a current guide for directing current from said first electrode through a current aperture to said active region, thereby to generate stimulated emission of radiation which propagates along said axis, a portion of said radiation forming an output signal which emerges from the resonator through at least one of said mirrors, characterized in that said current guide includes a stop-etch layer adjacent said one mirror, a first relatively highly doped layer adjacent said stop-etch layer, and a first lower doped layer adjacent said first highly doped layer, said first highly doped layer being essentially located at a node of the standing wave pattern of said radiation in said resonator.

2. The invention of claim 1 wherein said current guide further includes a second highly doped layer adjacent said lower doped layer on the side thereof opposite said first highly doped layer, each of said highly doped layers being located at a different node of said standing wave pattern.

3. The invention of claim 2 wherein said lower doped layer has a thickness given by $N\lambda/2n_A$, where N is a positive integer greater than one, $\lambda$ is the free-space wavelength of said radiation, and $n_A$ is the effective refractive index of said active region.

4. The invention of claim 2 wherein said first and second highly doped layers comprise GaAs and said lower doped layer comprises AlGaAs.

5. The invention of claim 4 wherein said stop-etch-layer comprises InGaP.

6. The invention of claim 1 wherein said current guide includes an oxide layer having an opening therein which forms said current aperture.

7. The invention of claim 1 wherein said current guide includes an ion-implanted zone with an opening therein which forms said current aperture.

8. The invention of claim 1 wherein said first electrode has an annular shape with an inside diameter greater than the diameter of said current aperture.

9. The invention of claim 3 wherein the thickness of said highly doped layer is a small fraction of $\lambda/2n_A$.

10. A VCSEL comprising first and second DBR mirrors each comprising interleaved sets of GaAs and AlAs layers of different refractive index, said mirrors forming a cavity resonator having a resonator axis perpendicular to said layers, a MQW active region disposed within said resonator, a current guide for directing current through a current aperture to said active region to generate stimulated emission of radiation which propagates along said axis, a portion of said radiation forming an output signal which emerges from said resonator through at least one of said mirrors, said current guide including an annular first electrode surrounding one of said mirrors and having an inside diameter larger than that of said current aperture, and a lateral injection structure for controlling the flow of current from said first electrode along a first path segment which is essentially perpendicular to said axis and from said first segment along a second path segment essentially parallel to said axis and then through said current aperture to said active region, said structure including a multi-layer stack disposed between said first electrode and said current aperture, said stack comprising an InGaP stop-etch layer adjacent said one mirror, a relatively thin, highly doped first GaAs layer located adjacent said stop-etch layer, a lower doped AlGaAs layer located adjacent said stop-etch layer, and a relatively thin, highly doped second GaAs layer adjacent said lower doped layer on the side thereof opposite to said first layer, each of said highly doped layers being essentially located at a different node of the standing wave of said radiation in said resonator, and a high resistivity zone disposed between said structure and said active region, said zone having an opening therein which forms said current aperture.

11. The invention of claim 10 wherein said lower doped layer has a thickness given by $N\lambda/2n_A$, where N is a positive integer greater than one, $\lambda$ is the free-space wavelength of said radiation, and $n_A$ is the effective refractive index of said active region.

12. The invention of claim 11 wherein the thickness of said highly doped layer is a small fraction of $\lambda/2n_A$.

* * * * *